(12) United States Patent
Yamahira et al.

(10) Patent No.: US 10,914,769 B2
(45) Date of Patent: Feb. 9, 2021

(54) SEMICONDUCTOR DEVICE AND POWER MONITORING METHOD THEREFOR

(71) Applicant: RENESAS ELECTRONICS CORPORATION, Tokyo (JP)

(72) Inventors: Toshiki Yamahira, Tokyo (JP); Masahiro Sakai, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 215 days.

(21) Appl. No.: 16/146,952

(22) Filed: Sep. 28, 2018

(65) Prior Publication Data

US 2019/0162760 A1 May 30, 2019

(30) Foreign Application Priority Data

Nov. 29, 2017 (JP) ................................. 2017-228570

(51) Int. Cl.
*G01R 19/25* (2006.01)
*H03K 21/38* (2006.01)
(Continued)

(52) U.S. Cl.
CPC ....... *G01R 19/2513* (2013.01); *H02H 1/0007* (2013.01); *H02H 1/0061* (2013.01);
(Continued)

(58) Field of Classification Search
CPC ............. G01R 19/2513; H02H 1/0007; H02H 1/0061; H02H 3/08; H02H 3/207;
(Continued)

(56) References Cited

U.S. PATENT DOCUMENTS 4,532,594 A 7/1985 Hosaka et al.
2007/0058453 A1* 3/2007 Shaffer .................. G06Q 50/06
365/189.05

(Continued)

FOREIGN PATENT DOCUMENTS

JP 2006-302614 A 11/2006

OTHER PUBLICATIONS

Extended European Search Report issued in corresponding European Patent Application No. 18206926.0-1201, dated Apr. 16, 2019.

*Primary Examiner* — Adolf D Berhane
(74) *Attorney, Agent, or Firm* — McDermott Will & Emery LLP

(57) ABSTRACT

According to an aspect of a present invention, there is provided a semiconductor device including a first power monitoring device and a second power monitoring device. The first power monitoring device outputs first operating power that is to be supplied to a second control section. The second power monitoring device outputs second operating power that is to be supplied to a first control section. Based on a first setting given from the first control section, a first power monitoring circuit autonomously verifies whether the second operating power is normal, and periodically transmits the result of verification to the second control section as first error information. Based on a second setting given from the second control section, a second power monitoring circuit autonomously verifies whether the first operating power is normal, and periodically transmits the result of verification to the first control section as second error information.

16 Claims, 14 Drawing Sheets

(51) Int. Cl.
  *H02H 1/00* (2006.01)
  *H02H 3/42* (2006.01)
  *H03K 21/08* (2006.01)
  *H02H 3/08* (2006.01)
  *H02M 1/00* (2006.01)
  *H02H 3/20* (2006.01)
  *H02H 3/10* (2006.01)

(52) U.S. Cl.
  CPC ............... *H02H 3/08* (2013.01); *H02H 3/10* (2013.01); *H02H 3/207* (2013.01); *H02H 3/42* (2013.01); *H02M 1/00* (2013.01); *H03K 21/08* (2013.01); *H03K 21/38* (2013.01); *H02M 2001/0003* (2013.01); *H02M 2001/0006* (2013.01)

(58) Field of Classification Search
  CPC .. H02H 3/42; H02M 1/00; H02M 2001/0003; H02M 2001/0006; H03K 21/08; H03K 21/38
  See application file for complete search history.

(56) References Cited

U.S. PATENT DOCUMENTS

| | | | |
|---|---|---|---|
| 2007/0076593 A1* | 4/2007 | Sakurai | B60W 50/0205 370/219 |
| 2009/0066527 A1* | 3/2009 | Teachman | G01R 22/10 340/657 |
| 2011/0074140 A1 | 3/2011 | Karner et al. | |
| 2013/0131904 A1* | 5/2013 | Park | B60L 3/0084 701/22 |
| 2014/0032173 A1* | 1/2014 | Kida | G06F 11/0751 702/183 |
| 2015/0003856 A1* | 1/2015 | Umimura | G03G 15/5004 399/88 |
| 2018/0106865 A1* | 4/2018 | Hashimoto | G01R 31/52 |
| 2019/0094903 A1* | 3/2019 | Laschinsky | G05B 19/042 |
| 2020/0073458 A1* | 3/2020 | Boyden | G06F 1/28 |
| 2020/0195538 A1* | 6/2020 | Omori | H04L 5/16 |

* cited by examiner

FIG. 2

EXEMPLARY REGISTER SETTINGS IN AUTOMATIC STATUS TRANSMISSION CIRCUIT

TRANSMISSION CONTROL REGISTER

| b7 | b6 | b5 | b4 | b3 | b2 | b1 | b0 |
|----|----|----|----|----|----|----|----|
| —  | —  | —  | —  | —  | —  | —  |    |

INITIAL VALUE  0  0  0  0  0  0  0  0 b7-b1: INVALID SETTING
b0: "0" TRANSMISSION FUNCTION DISABLED,
"1" TRANSMISSION FUNCTION ENABLED

TRANSMISSION INTERVAL REGISTER

| b7 | b6 | b5 | b4 | b3 | b2 | b1 | b0 |
|----|----|----|----|----|----|----|----|
|    |    |    |    |    |    |    |    |

INITIAL VALUE  0  0  0  0  0  0  0  0 b7-b0: '00'h - 'FF'h

CLOCK COUNT STORAGE REGISTER

| b7 | b6 | b5 | b4 | b3 | b2 | b1 | b0 |
|----|----|----|----|----|----|----|----|
|    |    |    |    |    |    |    |    |

INITIAL VALUE  0  0  0  0  0  0  0  0 b7-b0: COUNTER BIT VALUE (1 COUNT TO 256 COUNTS)

COUNTER SOURCE CLOCK REGISTER

| b7 | b6 | b5 | b4 | b3 | b2 | b1 | b0 |
|----|----|----|----|----|----|----|----|
|    |    |    |    |    |    |    |    |

INITIAL VALUE  0  0  0  0  0  0  0  0 b7-b4: INVALID SETTING
b3-b0: "0000" DIVIDED BY 2
"0001" DIVIDED BY 4
⋮         ⋮
"1111" DIVIDED BY 65563

FIG. 3

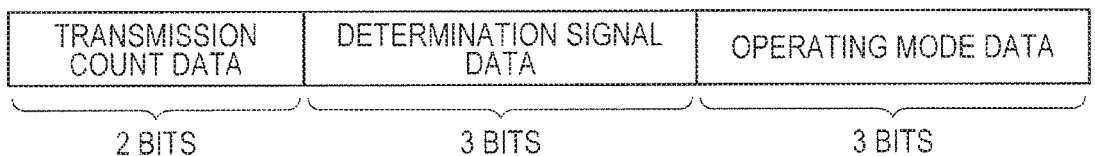

EXEMPLARY FORMAT FOR DETERMINATION INFORMATION TO BE
OUTPUTTED FROM AUTOMATIC STATUS TRANSMISSION CIRCUIT

| TRANSMISSION COUNT DATA | DETERMINATION SIGNAL DATA | OPERATING MODE DATA |
|---|---|---|
| 2 BITS | 3 BITS | 3 BITS |

TRANSMISSION COUNT DATA: DATA INDICATIVE OF NUMBER OF DETERMINATION
INFORMATION TRANSMISSIONS TO MICROCOMPUTER
(2-BIT LOOP VALUE)
b7-b6: "00"-"11"

DETERMINATION SIGNAL DATA: DATA INDICATIVE OF DETERMINATION SIGNAL OF
VOLTAGE/CURRENT MONITORING CIRCUIT
  b5: DETERMINATION SIGNAL OF UPPER-LIMIT
    VOLTAGE MONITORING SECTION
    ("0" NORMAL, "1" ABNORMAL)
  b4: DETERMINATION SIGNAL OF LOWER-LIMIT
    VOLTAGE MONITORING SECTION
    ("0" NORMAL, "1" ABNORMAL)
  b3: DETERMINATION SIGNAL OF UPPER-LIMIT
    CURRENT MONITORING SECTION
    ("0" NORMAL, "1" ABNORMAL)

OPERATING MODE DATA: DATA INDICATIVE OF OPERATING MODE OF VOLTAGE/
CURRENT MONITORING CIRCUIT
  b2: OPERATING MODE OF UPPER-LIMIT VOLTAGE
    MONITORING SECTION
    ("0" NORMAL, "1" ABNORMAL)
  b1: OPERATING MODE OF LOWER-LIMIT VOLTAGE
    MONITORING SECTION
    ("0" NORMAL, "1" ABNORMAL)
  b0: OPERATING MODE OF UPPER-LIMIT CURRENT
    MONITORING SECTION
    ("0" NORMAL, "1" ABNORMAL)

FIG. 8
EXEMPLARY REGISTER SETTINGS IN WDT

WDT CONTROL REGISTER

| b7 | b6 | b5 | b4 | b3 | b2 | b1 | b0 |
|---|---|---|---|---|---|---|---|
| — | — | — | — | — | — | — |   |

INITIAL VALUE  0 0 0 0 0 0 0 0 b7 - b1: INVALID SETTING
b0: "0" TRANSMISSION FUNCTION DISABLED
"1" TRANSMISSION FUNCTION ENABLED

CLOCK COUNT STORAGE REGISTER

| b7 | b6 | b5 | b4 | b3 | b2 | b1 | b0 |
|---|---|---|---|---|---|---|---|
|   |   |   |   |   |   |   |   |

INITIAL VALUE  0 0 0 0 0 0 0 0 b7 - b0: COUNTER BIT VALUE
(1 COUNT TO 256 COUNTS)

COUNTER SETTING REGISTER

| b7 | b6 | b5 | b4 | b3 | b2 | b1 | b0 |
|---|---|---|---|---|---|---|---|
|   |   |   |   |   |   |   |   |

INITIAL VALUE  0 0 0 0 0 0 0 0 b7 - b0: '00'h - 'FF'h

WINDOW SETTING REGISTER

| b7 | b6 | b5 | b4 | b3 | b2 | b1 | b0 |
|---|---|---|---|---|---|---|---|
|   |   |   |   |   |   |   |   |

INITIAL VALUE  0 0 0 0 0 0 0 0 b7 - b0: '00'h - 'FF'h

REFRESH SETTING REGISTER

| b7 | b6 | b5 | b4 | b3 | b2 | b1 | b0 |
|---|---|---|---|---|---|---|---|
| — | — | — | — | — | — | — |   |

INITIAL VALUE  0 0 0 0 0 0 0 0 b7 - b1: INVALID SETTING
b0: "0" DISABLED
"1" WDT CLOCK COUNTER CLEARED

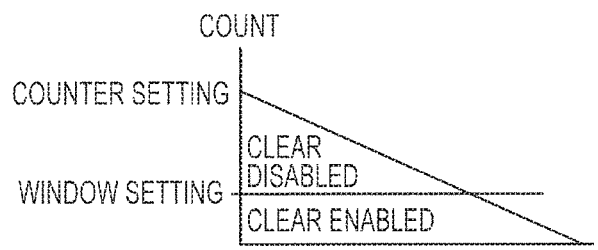

COUNTER SOURCE CLOCK REGISTER

| b7 | b6 | b5 | b4 | b3 | b2 | b1 | b0 |
|---|---|---|---|---|---|---|---|
|   |   |   |   |   |   |   |   |

INITIAL VALUE  0 0 0 0 0 0 0 0 b7 - b4: INVALID SETTING
b3 - b0: "0000" DIVIDED BY 2
"0001" DIVIDED BY 4
  :        :
"1111" DIVIDED BY 65563

FIG. 9

EXEMPLARY REGISTER SETTINGS IN POWER SHUTOFF CONTROL CIRCUIT

ERROR STATUS REGISTER

| b7 | b6 | b5 | b4 | b3 | b2 | b1 | b0 |
|----|----|----|----|----|----|----|----|
| —  | —  | —  | —  |    |    |    |    |

INITIAL VALUE  0  0  0  0  0  0  0  0

- b7-b4: INVALID SETTING
- b3: "0" WDT DETERMINED TO BE NORMAL,
  "1" WDT DETERMINED TO BE ABNORMAL
- b2: "0" UPPER-LIMIT VOLTAGE MONITORING SECTION DETERMINED TO BE NORMAL, "1" UPPER-LIMIT VOLTAGE MONITORING SECTION DETERMINED TO BE ABNORMAL
- b1: "0" LOWER-LIMIT VOLTAGE MONITORING SECTION DETERMINED TO BE NORMAL, "1" LOWER-LIMIT VOLTAGE MONITORING SECTION DETERMINED TO BE ABNORMAL
- b0: "0" UPPER-LIMIT CURRENT MONITORING SECTION DETERMINED TO BE NORMAL, "1" UPPER-LIMIT CURRENT MONITORING SECTION DETERMINED TO BE ABNORMAL

POWER SHUTOFF FACTOR ENABLE REGISTER

| b7 | b6 | b5 | b4 | b3 | b2 | b1 | b0 |
|----|----|----|----|----|----|----|----|
| —  | —  | —  | —  |    |    |    |    |

INITIAL VALUE  0  0  0  0  0  0  0  0

- b7-b4: INVALID SETTING
- b3: "0" POWER SHUTOFF DISABLED (WDT),
  "1" POWER SHUTOFF ENABLED (WDT)
- b2: "0" POWER SHUTOFF DISABLED (UPPER-LIMIT VOLTAGE MONITORING SECTION), "1" POWER SHUTOFF ENABLED (UPPER-LIMIT VOLTAGE MONITORING SECTION)
- b1: "0" POWER SHUTOFF DISABLED (LOWER-LIMIT VOLTAGE MONITORING SECTION), "1" POWER SHUTOFF ENABLED (LOWER-LIMIT VOLTAGE MONITORING SECTION)
- b0: "0" POWER SHUTOFF DISABLED (UPPER-LIMIT CURRENT MONITORING SECTION), "1" POWER SHUTOFF ENABLED (UPPER-LIMIT CURRENT MONITORING SECTION)

FIG. 13

EXEMPLARY REGISTER SETTINGS IN INPUT/OUTPUT SIGNAL MONITORING CIRCUIT

MODE SETTING REGISTER

| b7 | b6 | b5 | b4 | b3 | b2 | b1 | b0 |
|---|---|---|---|---|---|---|---|
| — | — | — | — | — | — |  |  |

INITIAL VALUE  0  0  0  0  0  0  0  0 b7-b2: "0" INVALID SETTING
    b1: "0" NORMAL MODE, "1" TEST MODE
    b0: "0" NORMAL MODE, "1" DIAGNOSTIC MODE

RESULT DETERMINATION REGISTER

| b7 | b6 | b5 | b4 | b3 | b2 | b1 | b0 |
|---|---|---|---|---|---|---|---|
| — | — | — | — | — | — | — |  |

INITIAL VALUE  0  0  0  0  0  0  0  0 b7-b1: OCCUPIED BIT
    b0: "0" NORMAL, "1" ABNORMAL

EXPECTED VALUE SETTING REGISTER

| b7 | b6 | b5 | b4 | b3 | b2 | b1 | b0 |
|---|---|---|---|---|---|---|---|
| — | — | — | — | — | — |  |  |

INITIAL VALUE  0  0  0  0  0  0  0  0 b7-b2: INVALID SETTING
    b1: "0" SETS EXPECTED VALUE OF INPUT SIGNAL TO 0,
        "1" SETS EXPECTED VALUE OF INPUT SIGNAL TO 1
    b0: "0" SETS EXPECTED VALUE OF OUTPUT SIGNAL TO 0,
        "1" SETS EXPECTED VALUE OF OUTPUT SIGNAL TO 1

SEMICONDUCTOR DEVICE AND POWER MONITORING METHOD THEREFOR

CROSS-REFERENCE TO RELATED APPLICATIONS

The disclosure of Japanese Patent Application No. 2017-228570 filed on Nov. 29, 2017 including the specification, drawings, and abstract is incorporated herein by reference in its entirety.

BACKGROUND

The present invention relates to a semiconductor device. For example, the present invention relates to a semiconductor device that is used to provide high reliability due to its multiplex configuration and detect an error in a multiplex configuration.

In recent years, system operations are monitored by using multiple monitoring systems in order to provide improved system reliability. Incorporating safety assurance functions into a system for configuration purposes in the above manner is referred to as functional safety. An example in which multiple monitoring systems are used for monitoring purposes is disclosed in Japanese Unexamined Patent Application Publication No. 2006-302614.

A control device described in Japanese Unexamined Patent Application Publication No. 2006-302614 uses a first MPU and a second MPU. The control device uses the second MPU to operate an output circuit, and uses the first MPU to observe the result of the output circuit operation. In such an instance, the control device establishes cross communication between the first MPU and the second MPU to check the output circuit for abnormality.

SUMMARY

However, in a configuration where two computing devices mutually verify an error as described in Japanese Unexamined Patent Application Publication No. 2006-302614, such a verification process consumes the computing power of the computing devices. Therefore, the processing capabilities of the computing devices cannot be fully exercised.

Other problems and novel features will become apparent from the following description and from the accompanying drawings.

According to an aspect of the present invention, there is provided a semiconductor device including a first power monitoring device and a second power monitoring device. The first power monitoring device outputs first operating power that is to be supplied to a second control section. The second power monitoring device outputs second operating power that is to be supplied to a first control section. Based on a first setting given from the first control section, a first power monitoring circuit autonomously verifies whether the second operating power is normal, and periodically transmits the result of verification to the second control section as first error information. Based on a second setting given from the second control section, a second power monitoring circuit autonomously verifies whether the first operating power is normal, and periodically transmits the result of verification to the first control section as second error information.

According to the above aspect of the present invention, the semiconductor device is capable of achieving early detection of abnormality in operating power given to a control section while reducing the amount of consumption of the computing power of the control section.

BRIEF DESCRIPTION OF THE DRAWINGS

FIG. 2 illustrates exemplary definition information about registers that store operation settings of an automatic status transmission circuit according to the first embodiment;

FIG. 3 illustrates an exemplary data format for error information to be outputted from the automatic status transmission circuit according to the first embodiment;

FIG. 8 illustrates exemplary definition information about registers that store operation settings of a watchdog timer according to the third embodiment;

FIG. 9 illustrates exemplary definition information about registers that store operation settings of a power shutoff control circuit according to the third embodiment;

FIG. 13 illustrates exemplary definition information about registers that store operation settings of the input/output signal monitoring circuit according to the fourth embodiment.

DETAILED DESCRIPTION

Figure 1:
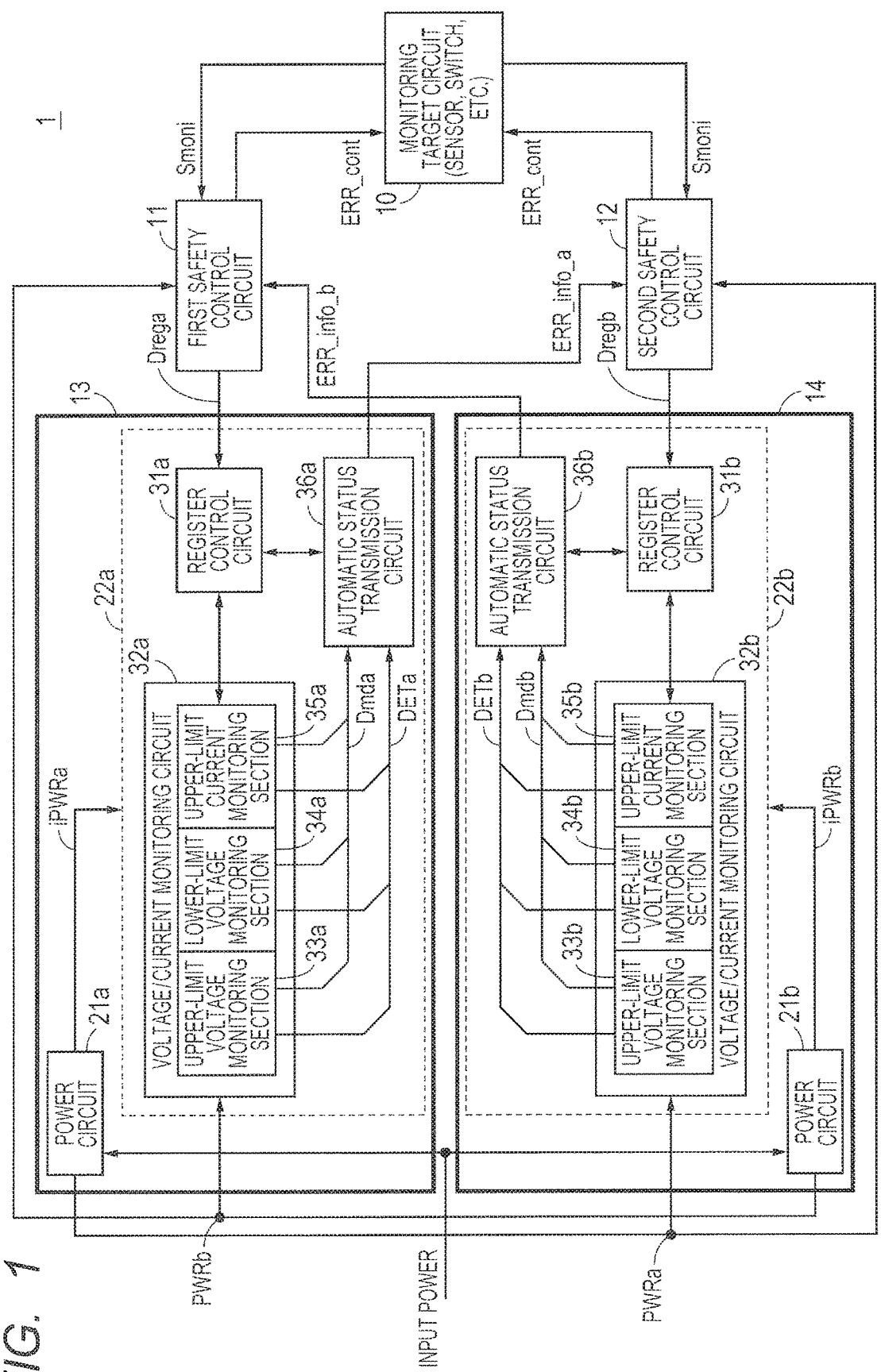
FIG. 1 is a block diagram illustrating a semiconductor device according to a first embodiment of the present invention.

In the following description and in the drawings, omissions and simplifications are made as needed for the clarification of explanation. Further, hardware for various elements depicted in the drawings as functional blocks performing various processes can be implemented by a CPU, a memory, or other circuit while software for such elements is implemented, for instance, by a program loaded into the memory. Therefore, it is to be understood by those skilled in the art that the functional blocks can be variously implemented by hardware only, by software only, or by a combination of hardware and software, and are not implemented restrictively by hardware alone or by software alone. Furthermore, like elements in the drawings are designated by like reference numerals and will not be redundantly described.

Moreover, the above-mentioned program can be stored on various types of non-transitory computer readable media and supplied to a computer. The non-transitory computer readable media include various types of tangible storage media. Examples of the non-transitory computer readable media include a magnetic recording medium (e.g., a flexible disk, a magnetic tape, or a hard disk), a magnetooptical recording medium (e.g., a magnetooptical disk), a CD-ROM (read-only memory), a CD-R, a CD-R/W, and a semiconductor memory (e.g., a mask ROM, a PROM (programmable ROM), an EPROM (erasable PROM), a flash ROM, or a RAM (random-access memory)). The program may be supplied to the computer by using various types of transitory computer readable media. Examples of the transitory computer readable media include an electrical signal, an optical signal, and an electromagnetic wave. The transitory computer readable media can supply the program to the computer through an electric wire, optical fiber, or other wired communication channel or through a wireless communication channel.

First Embodiment

FIG. 1 is a block diagram illustrating a semiconductor device 1 according to a first embodiment of the present invention. As illustrated in FIG. 1, the semiconductor device 1 according to the first embodiment includes a monitoring target circuit 10, a first safety control circuit 11, a second safety control circuit 12, a first power monitoring device 13, and a second power monitoring device 14. The semiconductor device 1 according to the first embodiment is configured so that the first safety control circuit 11, the second safety control circuit 12, the first power monitoring device 13, and the second power monitoring device 14 are formed over separate semiconductor chips. An alternative is to form the first safety control circuit 11 and the second safety control circuit 12 over a semiconductor chip and form the first power monitoring device 13 and the second power monitoring device 14 over a separate semiconductor chip that is different from the semiconductor chip over which the first safety control circuit 11 and the second safety control circuit 12 are formed. It should be noted that the monitoring target circuit 10 is a predetermined system including elements for inputting and outputting a signal, for example, of a sensor, elements for receiving a control signal input, for example, from a switch, and other devices such as semiconductor devices.

The semiconductor device 1 according to the first embodiment uses the first safety control circuit 11 and the second safety control circuit 12 to dually verify a monitor signal Smoni acquired from a checkpoint disposed in the monitoring target circuit 10. The first safety control circuit 11 and the second safety control circuit 12 are semiconductor devices that each include, for example, an MCU (microcontroller unit) or other arithmetic unit capable of executing a program, an analog-to-digital conversion circuit, a digital-to-analog conversion circuit, and a timer or other peripheral circuit that is used by the arithmetic unit.

Further, the semiconductor device 1 according to the first embodiment supplies operating power generated by different power circuits to the first safety control circuit 11 and the second safety control circuit 12, respectively. More specifically, the semiconductor device 1 supplies second operating power PWRb, which is generated by the second power monitoring device 14, to the first safety control circuit 11, and supplies first operating power PWRa, which is generated by the first power monitoring device 13, to the second safety control circuit 12. Furthermore, the semiconductor device 1 according to the first embodiment defines the operation of the first power monitoring device 13 by causing the first safety control circuit 11 to give a first setting (e.g., a register setting Drega) to the first power monitoring device 13. The semiconductor device 1 according to the first embodiment defines the operation of the second power monitoring device 14 by causing the second safety control circuit 12 to give a second setting (e.g., a register setting Dregb) to the second power monitoring device 14.

In the semiconductor device 1 according to the first embodiment, based on the register setting Drega, the first power monitoring device 13 autonomously detects abnormality in the second operating power PWRb, which is generated by the second power monitoring device 14 and supplied to the first safety control circuit 11. Further, in the semiconductor device 1 according to the first embodiment, based on the register setting Dregb, the second power monitoring device 14 autonomously detects abnormality in the first operating power PWRa, which is generated by the first power monitoring device 13 and supplied to the second safety control circuit 12. In another point of view, based on the register setting Drega stored in a register, the first power monitoring device 13 periodically monitors at least one of the voltage and current of the second operating power PWRb. If a monitored parameter is outside a preset reference range, the first power monitoring device 13 outputs first error information ERR_info_a to a second control section (e.g., the second safety control circuit 12). Meanwhile, based on the register setting Dregb stored in a register, the second power monitoring device 14 periodically monitors at least one of the voltage and current of the first operating power PWRa. If a monitored parameter is outside a preset reference range, the second power monitoring device 14 outputs second error information ERR_info_b to a first control section (e.g., the first safety control circuit 11).

In the semiconductor device 1 according to the first embodiment, the first power monitoring device 13 generates the first error information ERR_info_a by using the result of verification of abnormality in the second operating power PWRb, and outputs the first error information ERR_info_a to the second safety control circuit 12. Further, in the semiconductor device 1 according to the first embodiment, the second power monitoring device 14 generates the second error information ERR_info_b by using the result of verification of abnormality in the first operating power PWRa, and outputs the second error information ERR_info_b to the first safety control circuit 11.

In the semiconductor device 1 according to the first embodiment, the first power monitoring device 13 includes a first power circuit (e.g., a power circuit 21a) and uses the power circuit 21a to generate first internal power iPWRa. The first power monitoring device 13 then operates a monitoring processing section 22a by using the first internal power iPWRa. Further, in the semiconductor device 1 according to the first embodiment, the second power monitoring device 14 includes a second power circuit (e.g., a power circuit 21b) and uses the power circuit 21b to generate second internal power iPWRb. The second power monitoring device 14 then operates a monitoring processing section 22b by using the second internal power iPWRb. That is to say, the first power monitoring device 13 and second power monitoring device 14 according to the first embodiment receives the supplies of internal power, which differ in monitoring-target operating power, and performs an operating power monitoring process.

As described above, the semiconductor device 1 according to the first embodiment is characterized in that, for example, it has a mutual monitoring configuration in which the first operating power PWRa generated by one system is used and monitored by the other system and the second operating power PWRb generated by the other system is used and monitored by the one system. If an abnormality is found in operating power generated by one system during the use of the above system configuration, the other system, which is operating normally, is able to detect the abnormality and properly handle the abnormality.

More specifically, if, in the semiconductor device 1 according to the first embodiment, the first operating power PWRa generated by the first power monitoring device 13 is abnormal, the second power monitoring device 14, which receives the supply of the first operating power PWRa, operates in an unstable manner. In this instance, the second power monitoring device 14 in the semiconductor device 1 according to the first embodiment, which operates on power different from the first operating power PWRa, detects the abnormality in the first operating power PWRa and reports the abnormality in the first operating power PWRa to the first safety control circuit 11, which operates on the normal second operating power PWRb. Consequently, the semiconductor device 1 according to the first embodiment is able to properly handle a situation where system operations are unstable due to the abnormality in the first operating power PWRa, which is supplied to the second safety control circuit 12.

The semiconductor device 1 according to the first embodiment is also characterized in that the first power monitoring device 13 and the second power monitoring device 14 autonomously monitor abnormality in operating power. Further, the semiconductor device 1 according to the first embodiment is additionally characterized in that the first power monitoring device 13 and the second safety control circuit 12 operate on internal power generated by their built-in power circuits. Accordingly, the first power monitoring device 13 and the second power monitoring device 14, in particular, will be described in detail below.

As illustrated in FIG. 1, the first power monitoring device 13 according to the first embodiment includes the first power circuit (e.g., the power circuit 21a) and a first monitoring processing section (e.g., the monitoring processing section 22a). The monitoring processing section 22a includes a first register control circuit (e.g., a register control circuit 31a), a first power monitoring circuit (e.g., voltage/current monitoring circuit 32a), and a first automatic status transmission circuit (e.g., an automatic status transmission circuit 36a). The voltage/current monitoring circuit 32a includes an upper-limit voltage monitoring section 33a, a lower-limit voltage monitoring section 34a, and an upper-limit current monitoring section 35a.

Meanwhile, the second power monitoring device 14 according to the first embodiment includes the second power circuit (e.g., the power circuit 21b) and a second monitoring processing section (e.g., the monitoring processing section 22b). The monitoring processing section 22b includes a second register control circuit (e.g., a register control circuit 31b), a second power monitoring circuit (e.g., voltage/current monitoring circuit 32b), and a second automatic status transmission circuit (e.g., an automatic status transmission circuit 36b). The voltage/current monitoring circuit 32b includes an upper-limit voltage monitoring section 33b, a lower-limit voltage monitoring section 34b, and an upper-limit current monitoring section 35b.

As described above, in the example of FIG. 1, the first power monitoring device 13 and the second power monitoring device 14 have the same circuit configuration. Accordingly, the first power monitoring device 13 and the second power monitoring device 14 will be described in detail below by using the first power monitoring device 13 as an example. In FIG. 1, reference numerals for circuit blocks included in the first power monitoring device 13 are suffixed with a, and reference numerals for circuit blocks included in the second power monitoring device 14 are suffixed with b.

The power circuit 21a generates the first operating power PWRa and the first internal power iPWRa by increasing or decreasing the voltage of input power supplied from the outside. The first internal power iPWRa is drawn from the first power monitoring device 13 and supplied to the second safety control circuit 12, and at least one of the voltage and current of the first internal power iPWRa is monitored by the second power monitoring device 14. The first internal power iPWRa is supplied to the monitoring processing section 22a so that the monitoring processing section 22a operates based on the first internal power iPWRa.

The register control circuit 31a stores the register setting Drega, which is received from the first safety control circuit 11, in a register in the voltage/current monitoring circuit 32a and in a register in the automatic status transmission circuit 36a.

The voltage/current monitoring circuit 32a detects an abnormality in a monitoring-target operating power (e.g., the second operating power PWRb) and outputs a determination signal DETa for reporting the result of detection. Further, the voltage/current monitoring circuit 32a outputs an operating mode reporting signal Dmda in order to report a current operating mode. The voltage/current monitoring circuit 32a operates in a normal mode or in a test mode. In the normal mode, an abnormality in the second operating power PWRb is detected based on a normal determination value for determining that the second operating power PWRb is abnormal. In the test mode, the condition of the second operating power PWRb is determined based on a test determination value that turns out to be an error with respect to normal second operating power PWRb. The normal determination value, the test determination value, and a value indicative of the operating mode in the voltage/current monitoring circuit 32a are stored in registers in the voltage/current monitoring circuit 32a. The operating mode in the voltage/current monitoring circuit 32a is changed as needed in accordance with a register setting received from the first safety control circuit 11.

The voltage/current monitoring circuit 32a includes the upper-limit voltage monitoring section 33a, the lower-limit voltage monitoring section 34a, and the upper-limit current monitoring section 35a. The upper-limit voltage monitoring section 33a compares the voltage of the second operating power PWRb with an upper-limit voltage determination value stored in a register in the voltage/current monitoring circuit 32a. If the voltage of the second operating power PWRb is higher than the upper-limit voltage determination value, the upper-limit voltage monitoring section 33a outputs a determination signal DETa to indicate an error state. The lower-limit voltage monitoring section 34a compares the voltage of the second operating power PWRb with a lower-limit voltage determination value stored in a register in the voltage/current monitoring circuit 32a. If the voltage of the second operating power PWRb is lower than the lower-limit voltage determination value, the lower-limit voltage monitoring section 34a outputs the determination signal DETa to indicate an error state. The upper-limit current monitoring section 35a compares a current flowing in the second operating power PWRb with an upper-limit current determination value stored in a register in the voltage/current monitoring circuit 32a. If the current flowing in the second operating power PWRb is larger than the upper-limit current determination value, the upper-limit current monitoring section 35a outputs the determination signal DETa to indicate an error state.

The automatic status transmission circuit 36a generates error information in accordance with the operating mode reporting signal Dmda and with the determination signal DETa for reporting the result of monitoring by the voltage/current monitoring circuit 32a. More specifically, the automatic status transmission circuit 36a periodically generates the error information based on the collected operating mode reporting signal Dmda and determination signal DETa and periodically transmits the generated error information to the second safety control circuit 12. The automatic status transmission circuit 36a performs the periodical collection of the operating mode reporting signal Dmda and determination signal DETa and the periodical output of an error signal in accordance with settings stored in registers in the automatic status transmission circuit 36a. The automatic status transmission circuit 36a includes a counter (not shown) that counts a clock signal (not shown), and performs a periodical transmission operation in accordance with the count of the counter and with the setting in the register. Accordingly, the registers in the automatic status transmission circuit 36a will be described below.

FIG. 2 illustrates exemplary definition information about registers that store operation settings of the automatic status transmission circuit 36a according to the first embodiment. As illustrated in FIG. 2, the automatic status transmission circuit 36a includes a transmission control register, a transmission interval register, a clock count storage register, and a counter source clock register. It should be noted that the registers in the automatic status transmission circuit 36a, which are depicted in FIG. 2, are merely examples. The number of bits or the types of the registers depicted in FIG. 2 may be changed as appropriate in accordance with specifications. Further, some other registers may be added to those depicted in FIG. 2.

The transmission control register enables or disables a transmission function of the automatic status transmission circuit 36a. The transmission control register depicted in the example of FIG. 2 is configured so that the second to eighth bits of an 8-bit region are defined as an invalid setting region where values are ignored, and that a value in the first bit position determines whether or not to enable the transmission function. If, for example, the value in the first bit position of the transmission control register is 0, the transmission function is disabled. If, by contrast, the value in the first bit position is 1, the transmission function is enabled.

The transmission interval register sets intervals at which error information is to be automatically transmitted. More specifically, the transmission interval register stores the count of the counter that indicates the intervals at which the error information is to be outputted. In the example of FIG. 2, the transmission interval register has an 8-bit region and stores a value of 00 hex to FF hex by using an 8-bit value.

The clock count storage register stores the count of the counter. The counter resets the count when a value stored in the clock count storage register reaches a value stored in the transmission interval register. Further, when the value stored in the clock count storage register reaches the value stored in the transmission interval register, the automatic status transmission circuit 36a transmits currently prepared error information to the second safety control circuit 12. If the transmission function of the automatic status transmission circuit 36a is disabled, the counter is in a stopped state.

The counter source clock register sets a division ratio for a clock that is to be counted by the counter. In the example of FIG. 2, four high-order bits of eight bits are set as an invalid setting region where values are ignored, and four low-order bits form a division ratio setting region where the division ratio for the clock is specified in accordance with the value of the four low-order bits. If, for example, the value of the division ratio setting region is 0000, the counter counts a clock that is obtained by dividing a basic clock by 2. If the value of the division ratio setting region is 0001, the counter counts a clock that is obtained by dividing the basic clock by 4. If the value of the division ratio setting region is 1111, the counter counts a clock that is obtained by dividing the basic clock by 65536.

A format for error information to be outputted from the automatic status transmission circuit 36a will now be described. FIG. 3 illustrates an exemplary data format for error information to be outputted from the automatic status transmission circuit according to the first embodiment. The automatic status transmission circuit 36a according to the first embodiment receives the values of the operating mode reporting signal and determination signal from the voltage/current monitoring circuit 32a in parallel data form, converts the received values to serial data, and outputs the resulting serial data.

As illustrated in FIG. 3, the error information according to the first embodiment is 8-bit serial data. Three data fields, namely, a transmission count data field, a determination signal data field, and an operating mode data field, are defined in the error information. In the example of FIG. 3, the transmission count data field is defined as a 2-bit field, the determination signal data field is defined as a 3-bit field, and the operating mode data field is defined as a 3-bit field. The transmission count data field stores transmission count data having a value that cyclically changes at transmission intervals. That is to say, the value stored in the transmission count data field changes from 00 to 11 each time the error information is transmitted. The determination signal data field stores information about the determination signal in serial data form. The operating mode data field stores information about the operating mode reporting signal in serial data form.

Figure 4:
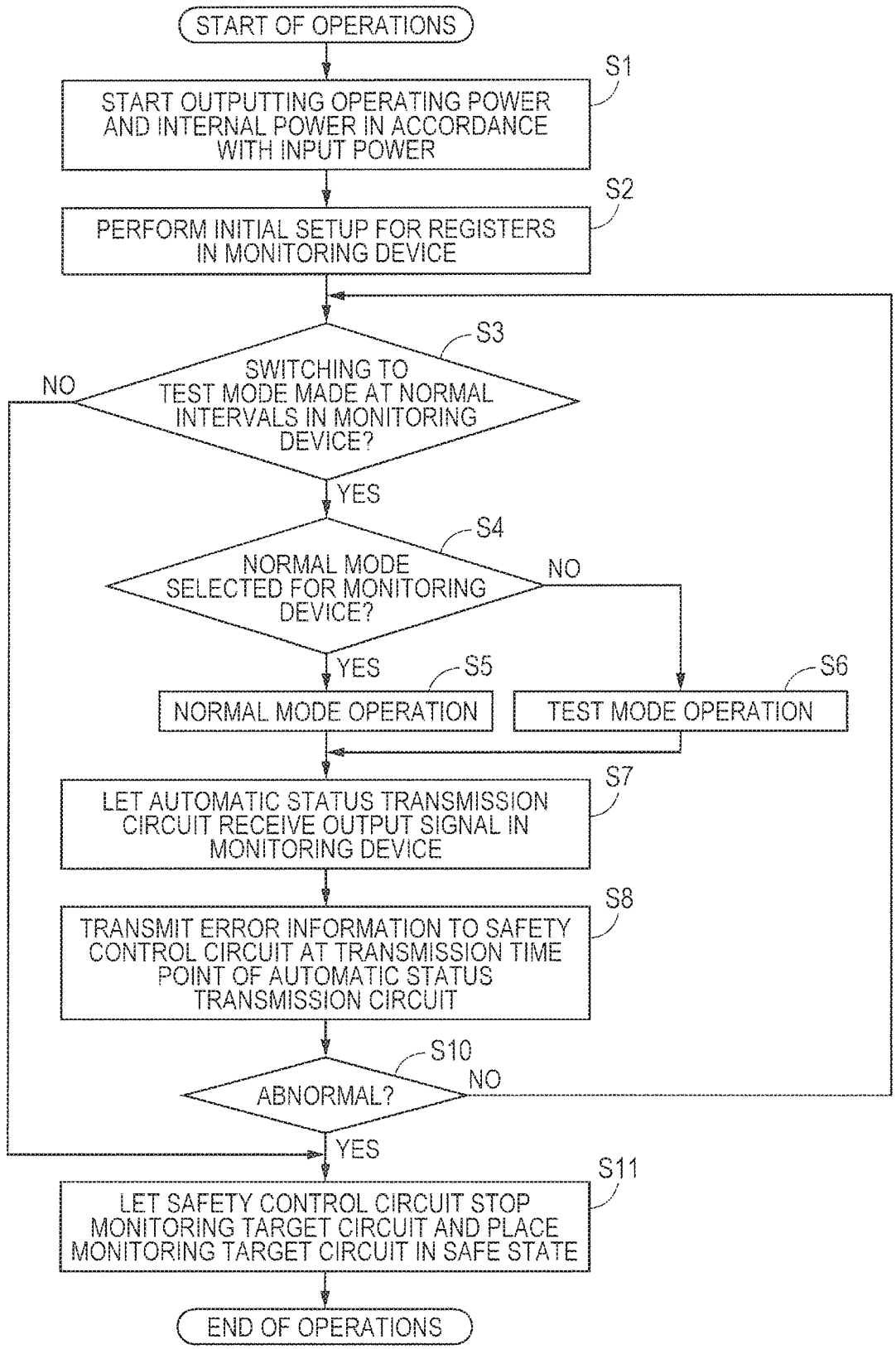
FIG. 4 is a flowchart illustrating the operations of the semiconductor device according to the first embodiment.

Operations of the semiconductor device 1 according to the first embodiment will now be described. FIG. 4 is a flowchart illustrating the operations of the semiconductor device according to the first embodiment. The following description is centered around the first safety control circuit 11, the second safety control circuit 12, and the first power monitoring device 13. Operations of the second power monitoring device 14 are the same as those of the first power monitoring device 13 and will not be redundantly described.

As illustrated in FIG. 4, when the supply of input power from the outside begins, the semiconductor device 1 according to the first embodiment causes the power circuit 21a in the first power monitoring device 13 to start outputting the first operating power PWRa and the first internal power iPWRa (step S1). This activates the second safety control circuit 12 and the first power monitoring device 13. In step S1, the power circuit 21b in the second power monitoring device 14 starts outputting the second operating power PWRb and the second internal power iPWRb, thereby activating the first safety control circuit 11 and the second power monitoring device 14.

Next, the first safety control circuit 11 performs initial setup for the registers in the first power monitoring device 13 (step S2). In a register setup process performed in step S2, the first safety control circuit 11 gives, for example, the register values of the automatic status transmission circuit 36a, which are described with reference to FIG. 2, to the first power monitoring device 13 as the register setting Drega.

When this initial setup is performed for the registers, the first power monitoring device 13 starts operating. When steps S1 and S2 are performed, the first power monitoring device 13 starts to autonomously monitor the operating power.

Subsequently, in accordance with first error information Error_Info_a that the second safety control circuit 12 has received from the first power monitoring device 13, the second safety control circuit 12 in the semiconductor device 1 according to the first embodiment confirms whether a test mode operation is periodically performed in the first power monitoring device 13 (step S3). If periodical switching to the test mode is not made, the second safety control circuit 12 determines that the first safety control circuit 11, which changes the operating mode of the voltage/current monitoring circuit 32$a$ in the first power monitoring device 13, may be faulty, or determines that the first power monitoring device 13 may be faulty. In this instance, the second safety control circuit 12 performs a process for stopping the operation of the monitoring target circuit 10 and places the monitoring target circuit 10 in a safe state (step S11).

If, by contrast, the second safety control circuit 12 confirms that the first power monitoring device 13 is operating while switching the operating mode to the test mode at predetermined intervals, the first power monitoring device 13 operates the voltage/current monitoring circuit 32$a$ in the normal mode during a normal mode interval or operates the voltage/current monitoring circuit 32$a$ in the test mode during a test mode interval (steps S4 to S6).

Subsequently, the automatic status transmission circuit 36$a$ receives output signals (e.g., the operating mode reporting signal Dmda and determination signal DETa outputted from the voltage/current monitoring circuit 32$a$) in the first power monitoring device 13, and generates the first error information Error_Info_a (step S7). Then, at a predetermined transmission time point, the automatic status transmission circuit 36$a$ transmits the currently generated first error information Error_Info_a to the second safety control circuit 12 (step S8).

Next, in accordance with the first error information Error_Info_a received in step S8, the second safety control circuit 12 confirms whether the second internal power iPWRb is abnormal or the first power monitoring device 13 is operating in an abnormal manner (step S10). If the second safety control circuit 12 determines in step S10 that all states are normal, steps S3 to S10 are repeated. A time point for changing the register setting Drega to be given to the first power monitoring device 13 is changed as needed by the first safety control circuit between steps S3 and S10.

If, by contrast, the second safety control circuit 12 determines in step S10 that the second internal power iPWRb is abnormal or the first power monitoring device 13 is operating in an abnormal manner, the second safety control circuit 12 performs a process for stopping the operation of the monitoring target circuit 10 and places the monitoring target circuit 10 in a safe state (step S11).

As described above, the semiconductor device 1 according to the first embodiment monitors abnormality in monitoring target operating power by using a power monitoring device that operates on internal power generated by a system different from a system related to the monitoring target operating power. This makes it possible to accurately detect abnormality in the operating power. Further, the semiconductor device 1 according to the first embodiment reports abnormality in the monitoring target operating power to a safety control circuit that operates on operating power generated by a system different from a system related to the monitoring target operating power. This makes it possible to properly avoid an error when abnormality is detected.

Furthermore, in the semiconductor device 1 according to the first embodiment, the first power monitoring device 13 autonomously detects abnormality in the second operating power PWRb in accordance with the first register setting Drega given from the first safety control circuit 11, and the second power monitoring device 14 detects abnormality in the first operating power PWRa in accordance with the second register setting Dregb. Therefore, the semiconductor device 1 according to the first embodiment is able to monitor abnormality in monitoring target operating power without using the processing capabilities of the first safety control circuit 11 and second safety control circuit 12. That is to say, the semiconductor device 1 according to the first embodiment is able to monitor the monitoring target circuit 10 while making the most of the processing capabilities of the first safety control circuit 11 and second safety control circuit 12.

Moreover, the semiconductor device 1 according to the first embodiment is able to change as needed the operating conditions of the first power monitoring device 13 and second power monitoring device 14 by using a register setting. Therefore, in the semiconductor device 1 according to the first embodiment, operations conforming to the conditions of a system where the first power monitoring device 13 and the second power monitoring device 14 are used can be changed in accordance with instructions from software built in the first safety control circuit 11 and the second safety control circuit 12. This eliminates the necessity of preparing the first power monitoring device 13 and the second power monitoring device 14 by changing their operating conditions for each applied system. Additionally, while the first power monitoring device 13 and second power monitoring device 14 according to the first embodiment are operating, they are able to change their operating conditions in accordance with the operating state (e.g., temperature) of an applied system.

Further, if the voltage/current monitoring circuit 32$a$ and the voltage/current monitoring circuit 32$b$ are in a pseudo error state at predetermined intervals, the semiconductor device 1 according to the first embodiment performs the test mode operation. Therefore, the semiconductor device 1 according to the first embodiment is able to detect an internal failure in the first power monitoring device 13 and the second power monitoring device 14. That is to say, system reliability can be improved by using the first power monitoring device 13 and second power monitoring device 14 according to the first embodiment.

Furthermore, the semiconductor device 1 according to the first embodiment is configured so that the error information transmitted from a power monitoring device to a safety control circuit includes the transmission count data field. A value in the transmission count data field changes each time a transmission process is performed. Therefore, a safety control circuit in the semiconductor device 1 according to the first embodiment is able to detect abnormality in the automatic status transmission circuit of a power monitoring device or abnormality in a clock signal used in a power monitoring device.

Moreover, the semiconductor device 1 according to the first embodiment is configured so that the error information transmitted from a power monitoring device to a safety control circuit includes the determination signal data field and the operating mode data field. Therefore, the semiconductor device 1 according to the first embodiment is able to handle an error encountered in the test mode as a pseudo error, and use the first safety control circuit to determine whether the voltage/current monitoring circuit is operating properly.

Second Embodiment

A second embodiment of the present invention will now be described by explaining about a first power monitoring circuit 43 and a second power monitoring circuit 44. The first power monitoring circuit 43 and the second power monitoring circuit 44 are elements alternative to the first power monitoring device 13 and second power monitoring device 14 according to the first embodiment. In the following explanation of the second embodiment, elements identical with those described in conjunction with the first embodiment are designated by the same reference numerals as the corresponding elements in the first embodiment, and will not be redundantly described.

Figure 5:
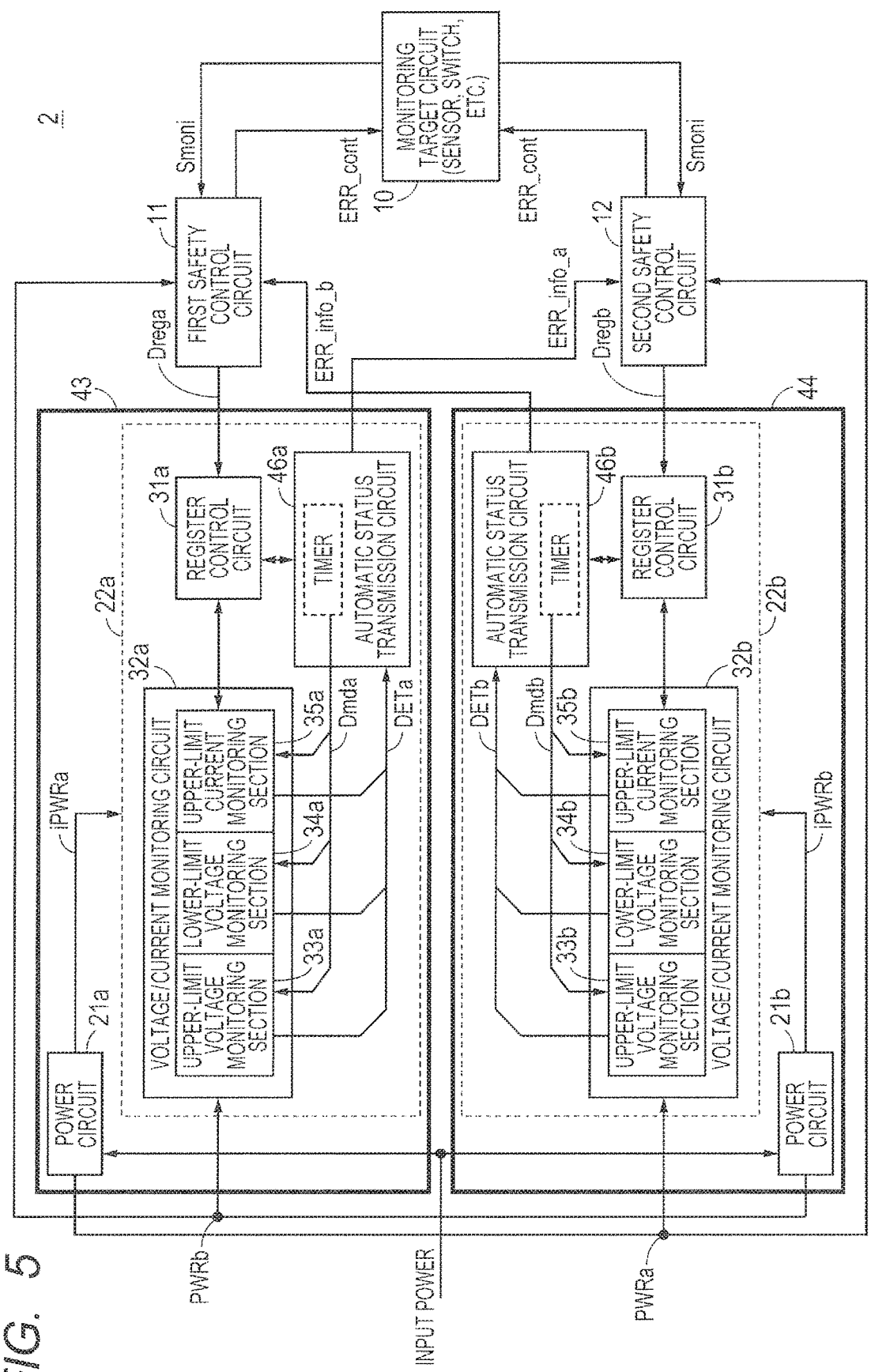
FIG. 5 is a block diagram illustrating the semiconductor device according to a second embodiment of the present invention.

FIG. 5 is a block diagram illustrating a semiconductor device 2 according to the second embodiment. As illustrated in FIG. 5, the first power monitoring circuit 43 is obtained by replacing the automatic status transmission circuit 36a with an automatic status transmission circuit 46a. The second power monitoring circuit 44 is obtained by replacing the automatic status transmission circuit 36b with an automatic status transmission circuit 46b.

The automatic status transmission circuit 46a and the automatic status transmission circuit 46b are obtained by adding a timer to the automatic status transmission circuit 36a and the automatic status transmission circuit 36b. The timer is configured so that the logic level of its output signal changes at predetermined intervals. The semiconductor device 2 according to the second embodiment uses the output of the timer as an operating mode reporting signal so that the upper-limit voltage monitoring section, the lower-limit voltage monitoring section, and the upper-limit current monitoring section change their operating modes in accordance with the operating mode reporting signal given from the timer. In the example of FIG. 5, upper-limit voltage monitoring sections 33a, 33b, lower-limit voltage monitoring sections 34a, 34b, and upper-limit current monitoring sections 35a, 35b change their operating modes in accordance with operating mode reporting signals Dmda, Dmdb given from the timer.

Figure 6:
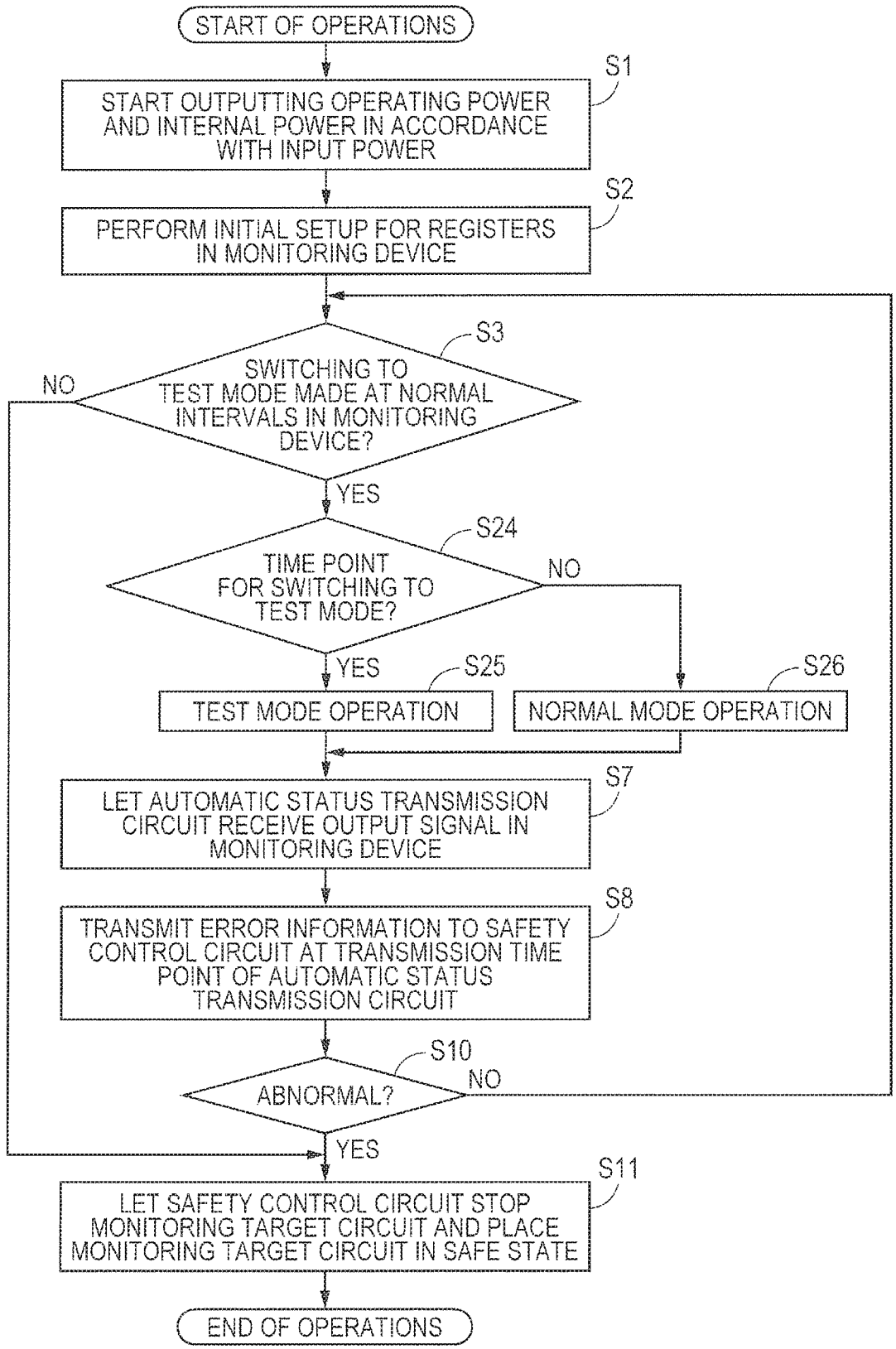
FIG. 6 is a flowchart illustrating the operations of semiconductor device according to the second embodiment.

Operations of the semiconductor device 2 according to the second embodiment will now be described. FIG. 6 is a flowchart illustrating the operations of the semiconductor device 2 according to the second embodiment. As illustrated in FIG. 6, the operations of the semiconductor device 2 according to the second embodiment are such that steps S4 to S6 in FIG. 4, which illustrates the operations the semiconductor device 1 according to the first embodiment, are replaced by steps S24 to S26.

Step S24 is performed subsequently to step S3 in which a check is performed to determine whether switching to the test mode is made at normal intervals. As the operating mode reporting signal Dmda is switched each time predetermined time is counted by the timer of the automatic status transmission circuit 46a in the first power monitoring device 43, step S24 is performed to determine whether the current operating mode is the test mode or the normal mode as a result of this operating mode change. The first power monitoring device 43 then operates the voltage/current monitoring circuit 32a in the normal mode during a normal mode interval, and operates the voltage/current monitoring circuit 32a in the test mode during a test mode interval (steps S25 and S26).

As described above, the semiconductor device 2 according to the second embodiment switches the operating mode of the voltage/current monitoring circuit in accordance with the timer disposed in the automatic status transmission circuit. That is to say, unlike the semiconductor device 1 according to the first embodiment, the semiconductor device 2 according to the second embodiment eliminates the necessity of causing a safety control circuit to perform register setup for a power monitoring device for operating mode switching purposes. Therefore, the semiconductor device 2 according to the second embodiment is capable of reducing computing resources for a safety control circuit. Consequently, as compared to the first embodiment, the second embodiment is capable of allocating the computing resources for a safety control circuit to monitoring a monitoring target circuit.

Third Embodiment

A third embodiment of the present invention will now be described by explaining about a first power monitoring circuit 53 and a second power monitoring circuit 54. The first power monitoring circuit 53 and the second power monitoring circuit 54 are elements alternative to the first power monitoring device 13 and second power monitoring device 14 according to the first embodiment. In the following explanation of the third embodiment, elements identical with those described in conjunction with the first embodiment are designated by the same reference numerals as the corresponding elements in the first embodiment, and will not be redundantly described.

Figure 7:
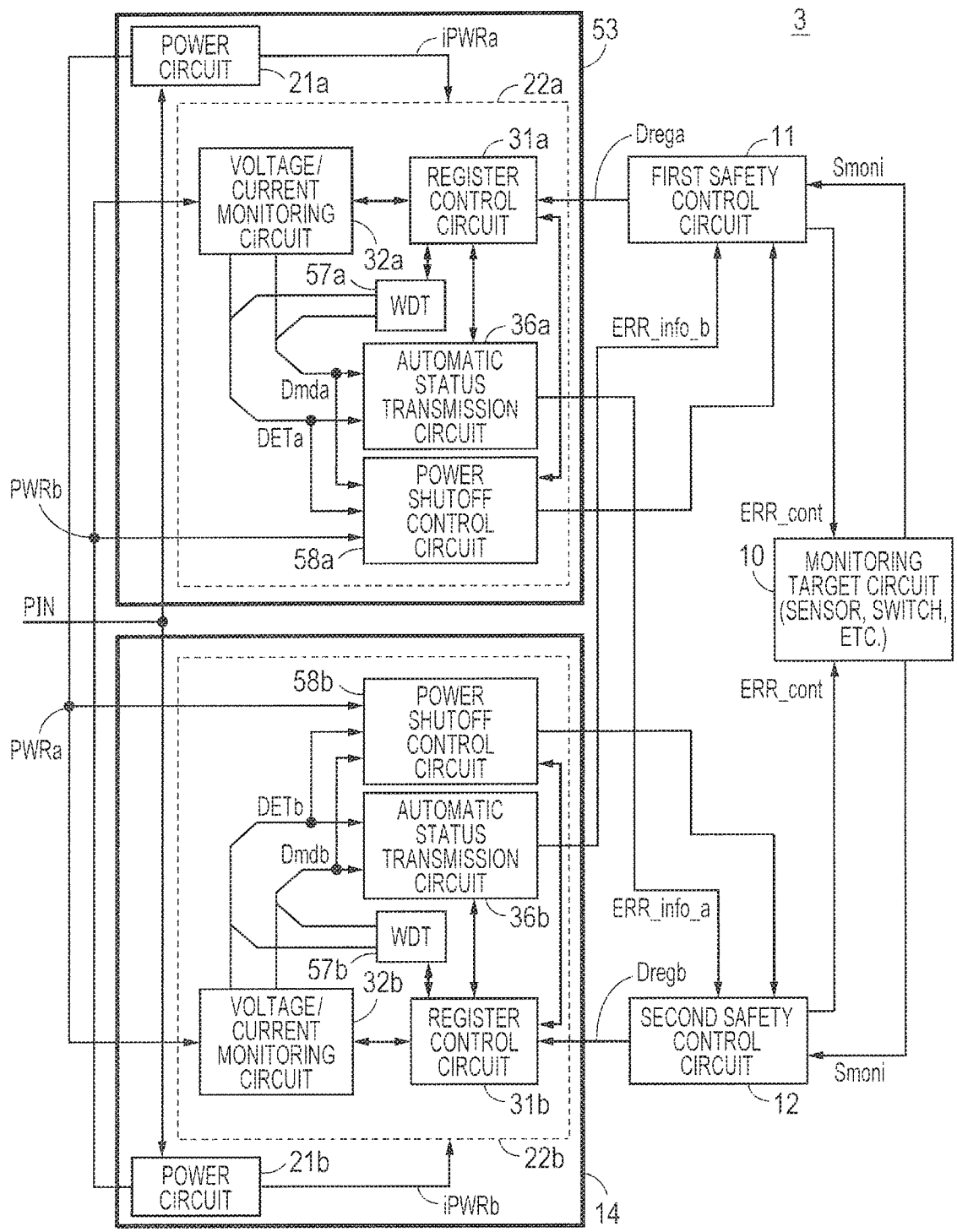
FIG. 7 is a block diagram illustrating the semiconductor device according to a third embodiment of the present invention.

FIG. 7 is a block diagram illustrating a semiconductor device 3 according to the third embodiment. As illustrated in FIG. 7, the first power monitoring circuit 53 is obtained by adding a watchdog timer 57a and a power shutoff control circuit 58a to the first power monitoring device 13. The second power monitoring circuit 54 is obtained by adding a watchdog timer 57b and a power shutoff control circuit 58b to the second power monitoring device 14.

The watchdog timers monitor the operating state of a device that transmits a setting to a register in a local device. More specifically, the watchdog timer 57a monitors the operations of the first safety control circuit 11, which transmits the first register setting Drega to the first power monitoring circuit 53. The watchdog timer 57b monitors the operations of the second safety control circuit 12, which transmits the second register setting Dregb to the second power monitoring circuit 54. Further, the watchdog timer 57a outputs the operating mode reporting signal Dmda and the determination signal DETa, as is the case with the voltage/current monitoring circuit 32a. Meanwhile, the watchdog timer 57b outputs the operating mode reporting signal Dmdb and the determination signal DETb, as is the case with the voltage/current monitoring circuit 32b.

As the watchdog timers 57a, 57b are identical with each other, registers in the watchdog timer 57a are described below by way of example. In order to confirm the validity of a program executed by the first safety control circuit 11, the watchdog timer 57a monitors the behavior of the first safety control circuit 11 and outputs the result of monitoring as the determination signal DETa. Here, the watchdog timer 57a is able to enable or disable its functionality and change the setting, for example, of the window range of a counter clear disable period by using a register. In regard to this point, FIG. 8 illustrates exemplary definition information about registers that store operation settings of the watchdog timer 57a according to the third embodiment. Here, it is assumed that the watchdog timer 57a includes a downward counter.

As illustrated in FIG. 8, the watchdog timer 57a includes a WDT control register, a clock count storage register, a counter setting register, a window setting register, a refresh setting register, and a counter source clock register. FIG. 8 additionally depicts a graph that outlines the counter clear disable period.

The WDT control register enables or disables a watchdog timer function. The WDT control register depicted in the example of FIG. 8 is configured so that the second to eighth bits of an 8-bit region are defined as an invalid setting region where values are ignored, and that a value in the first bit position determines whether or not to enable the watchdog timer function. If, for example, the value in the first bit position of the WDT control register is 0, the watchdog timer function is disabled. If, by contrast, the value in the first bit position is 1, the watchdog timer function is enabled.

The counter setting register stores a count until the counter underflows. The counter setting register has an 8-bit region and stores a value of 00 hex to FF hex by using an 8-bit value.

The clock count storage register stores the count of the counter. The watchdog timer 57a handles a value stored in the counter setting register as the maximum value, causes the counter to count down, and decreases the value of the clock count storage register in accordance with a downward counting operation. When the value of the clock count storage register is 00 hex, the counter underflows. When underflow occurs, the watchdog timer 57a switches the determination signal DETa from a normal value to an abnormal value. If the watchdog timer function of the watchdog timer 57a is disabled, the counter stops.

The window setting register sets a clear disable period of the counter. If a later-described reset operation occurs while the value of the clock count storage register is greater than the value of the window setting register, the watchdog timer 57a switches the determination signal DETa from the normal value to the abnormal value. A period during which a process is performed to switch the determination signal DETa from the normal value to the abnormal value due to the reset operation is referred to as the clear disable period. The window setting register has an 8-bit region and stores a value of 00 hex to FF hex by using an 8-bit value.

The refresh setting register sets whether or not to refresh a clock counter value. In the watchdog timer 57a, rewriting the clock counter value to a counter setting register value is referred to as a reset. If the first bit of the refresh setting register is 0, a refresh function is disabled. If, by contrast, the first bit of the refresh setting register is 1, the value of the counter setting register is transferred to the clock count storage register, and when the value of the counter setting register is transferred to the clock count storage register, the value of the first bit of the refresh setting register reverts to 0. Further, if the value of the refresh setting register is 1 during the clear disable period, the watchdog timer 57a switches the determination signal DETa from the normal value to the abnormal value.

The counter source clock register sets the division ratio for the clock counted by the counter. In the example of FIG. 8, four high-order bits of eight bits are set as an invalid setting region where values are ignored, and four low-order bits form a division ratio setting region where the division ratio for the clock is specified in accordance with the value of the four low-order bits. If, for example, the value of the division ratio setting region is 0000, the counter counts a clock that is obtained by dividing the basic clock by 2. If the value of the division ratio setting region is 0001, the counter counts a clock that is obtained by dividing the basic clock by 4. If the value of the division ratio setting region is 1111, the counter counts a clock that is obtained by dividing the basic clock by 65536.

The power shutoff control circuits determine, in accordance with an operating mode reporting signal and a determination signal, whether or not to output, to the outside, operating power to be monitored by the local device. In the example of FIG. 7, the first power shutoff control circuit 58a determines, in accordance with the operating mode reporting signal Dmda and the determination signal DETa, whether or not to output the second operating power PWRb to the outside. The second power shutoff control circuit 58b determines, in accordance with the operating mode reporting signal Dmdb and the determination signal DETb, whether or not to output the first operating power PWRa to the outside.

Registers in the power shutoff control circuit 58a and power shutoff control circuit 58b will now be described. As the power shutoff control circuit 58a and the power shutoff control circuit 58b are identical with each other, the power shutoff control circuit 58a is described below by way of example in order to explain about the power shutoff control circuits. FIG. 9 illustrates exemplary definition information about registers that store operation settings of the power shutoff control circuit 58a according to the third embodiment.

As illustrated in FIG. 9, the power shutoff control circuit 58a includes an error status register and a power shutoff factor enable register. The error status register stores the value of the determination signal that is received together with the operating mode reporting signal indicative of the normal mode. The error status register depicted in the example of FIG. 9 is configured so that the fifth to eighth bits of an 8-bit region are defined as an invalid setting region where values are ignored. Further, the error status register stores a value of the determination signal DETa from the watchdog timer 57a in the fourth bit position, stores a value of the determination signal DETa from the upper-limit voltage monitoring section 33a in the third bit position, stores a value of the determination signal DETa from the lower-limit voltage monitoring section 34a in the second bit position, and stores a value of the determination signal DETa from the upper-limit current monitoring section 35a in the first bit position. If the stored value is 0, the power shutoff control circuit 58a determines that no abnormality is detected in the first power monitoring circuit 53, and allows the second operating power PWRb to pass. If, by contrast, the stored value is 1, the power shutoff control circuit 58a determines that an abnormality has occurred in a portion corresponding to a bit at which the value 1 is stored, and then determines, in accordance with a setting in the power shutoff factor enable register, whether or not to shut off the second operating power PWRb.

The power shutoff factor enable register defines a failure factor for shutting off the operating power. The power shutoff factor enable register depicted in the example of FIG. 9 is configured so that the fifth to eighth bits of an 8-bit region are defined as an invalid setting region where values are ignored. Further, the power shutoff factor enable register stores, in the fourth bit position, a value that is based on the determination signal DETa from the watchdog timer 57a and used to determine whether or not to perform a power shutoff process, stores, in the third bit position, a value that is based on the determination signal DETa from the upper-limit voltage monitoring section 33a and used to determine whether or not to perform the power shutoff process, stores, in the second bit position, a value that is based on the determination signal DETa from the lower-limit voltage monitoring section 34a and used to determine whether or not to perform the power shutoff process, and stores, in the first bit position, a value that is based on the determination signal DETa from the upper-limit current monitoring section 35a and used to determine whether or not to perform the power shutoff process. If the values in the same bit positions are both 1, the power shutoff control circuit 58a shuts off the second operating power PWRb. Meanwhile, if the first power monitoring circuit 53 is placed in the test mode and the determination signal is an abnormal value even in a situation where the values in the same bit positions are both 1, the power shutoff control circuit 58a does not shut off the second operating power PWRb, but allows it to pass.

Figure 10:
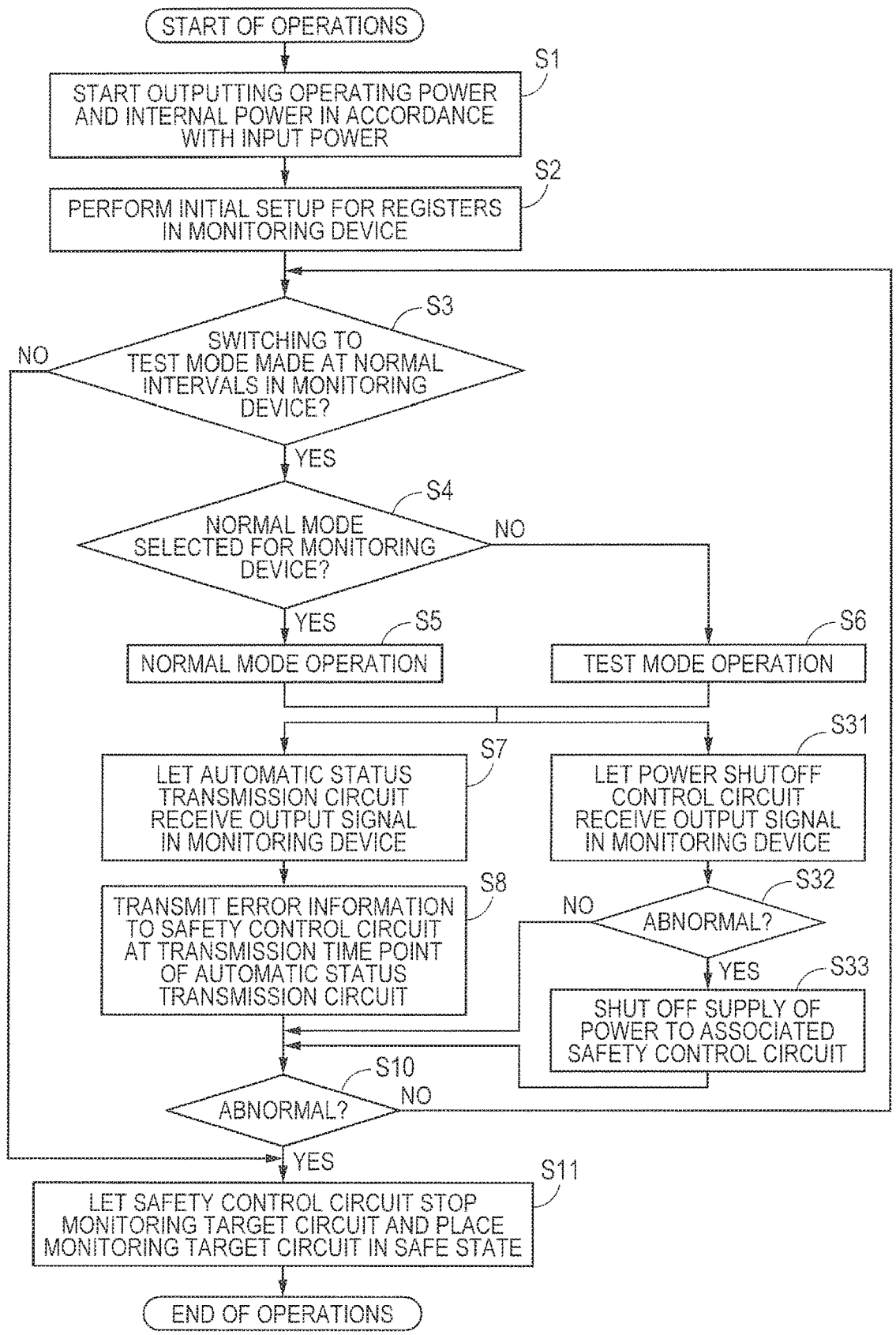
FIG. 10 is a flowchart illustrating the operations of the semiconductor device according to the third embodiment.

Operations of the semiconductor device 3 according to the third embodiment will now be described. FIG. 10 is a flowchart illustrating the operations of the semiconductor device 3 according to the third embodiment. As illustrated in FIG. 10, the operations of the semiconductor device 3 according to the third embodiment are such that steps S31 to S33 are added to the operations of the semiconductor device 1 according to the first embodiment.

Steps S31 to S33 are performed in parallel with steps S7 and S8. In step S31, the power shutoff control circuit 58a and the power shutoff control circuit 58b receive the determination signal and operating mode reporting signal that are obtained in step S5 or S6. Then, the power shutoff control circuits determine, in accordance with the received determination signal and operating mode reporting signal, whether monitoring target parameters are abnormal (step S32). If, it is determined in step S32 that no abnormality exists, the power shutoff control circuits wait until the next operating cycle. If, by contrast, it is determined in step S32 that an abnormality exists, the power shutoff control circuits shut off the operating power to be supplied to the safety control circuits (step S33).

Subsequently, in steps S7 to S10, the semiconductor device according to the third embodiment causes the first power monitoring circuit 53 to report the occurrence of abnormality to the second safety control circuit 12 or causes the second power monitoring circuit 54 to report the occurrence of abnormality to the first safety control circuit 11. Then, a safety control circuit that has received the report of the occurrence of abnormality performs a process on the monitoring target circuit 10 in order to prevent error expansion (step S11).

As described above, the semiconductor device 3 according to the third embodiment is able to detect an abnormal program execution in the first safety control circuit 11 and the second safety control circuit 12 by using the watchdog timer.

When the above abnormality occurs, the monitoring operation on the monitoring target circuit 10 may be obstructed even if the operating power is normal. Therefore, if an abnormal program execution occurs in a safety control circuit, the semiconductor device 3 according to the third embodiment prevents the expansion of damage by shutting off the supply of operating power to the safety control circuit. Further, when the above abnormality occurs, an operation stop process may not be properly performed on the monitoring target circuit even if the safety control circuit receives error information including abnormality determination data. Even in such an instance, the operation stop process can be properly performed on the monitoring target circuit by allowing the watchdog timer to detect an abnormal safety control circuit and causing the other safety control circuit, which is normal, to receive error information including the relevant abnormality determination data through the automatic status transmission circuit. As a result, the semiconductor device 3 according to the third embodiment is able to improve system reliability.

Further, even if operating power is abnormal, the semiconductor device 3 according to the third embodiment causes a power shutoff control circuit to shut off the operating power. Consequently, the semiconductor device 3 according to the third embodiment is able to prevent the expansion of a safety control circuit failure or damage by shutting off the supply of abnormal operating power earlier than the semiconductor devices according to the foregoing embodiments. If, for example, an overvoltage or an overcurrent occurs in operating power, elements included in a safety control circuit may become faulty. If, in such an instance, the supply of operating power is shut off early, it may be possible to avoid the failure of such elements.

Fourth Embodiment

A fourth embodiment of the present invention will now be described by explaining about a first power monitoring circuit 63 and a second power monitoring circuit 64. The first power monitoring circuit 63 and the second power monitoring circuit 64 are elements alternative to the first power monitoring device 13 and second power monitoring device 14 according to the first embodiment. In the following explanation of the fourth embodiment, elements identical with those described in conjunction with the first embodiment are designated by the same reference numerals as the corresponding elements in the first embodiment, and will not be redundantly described.

Figure 11:
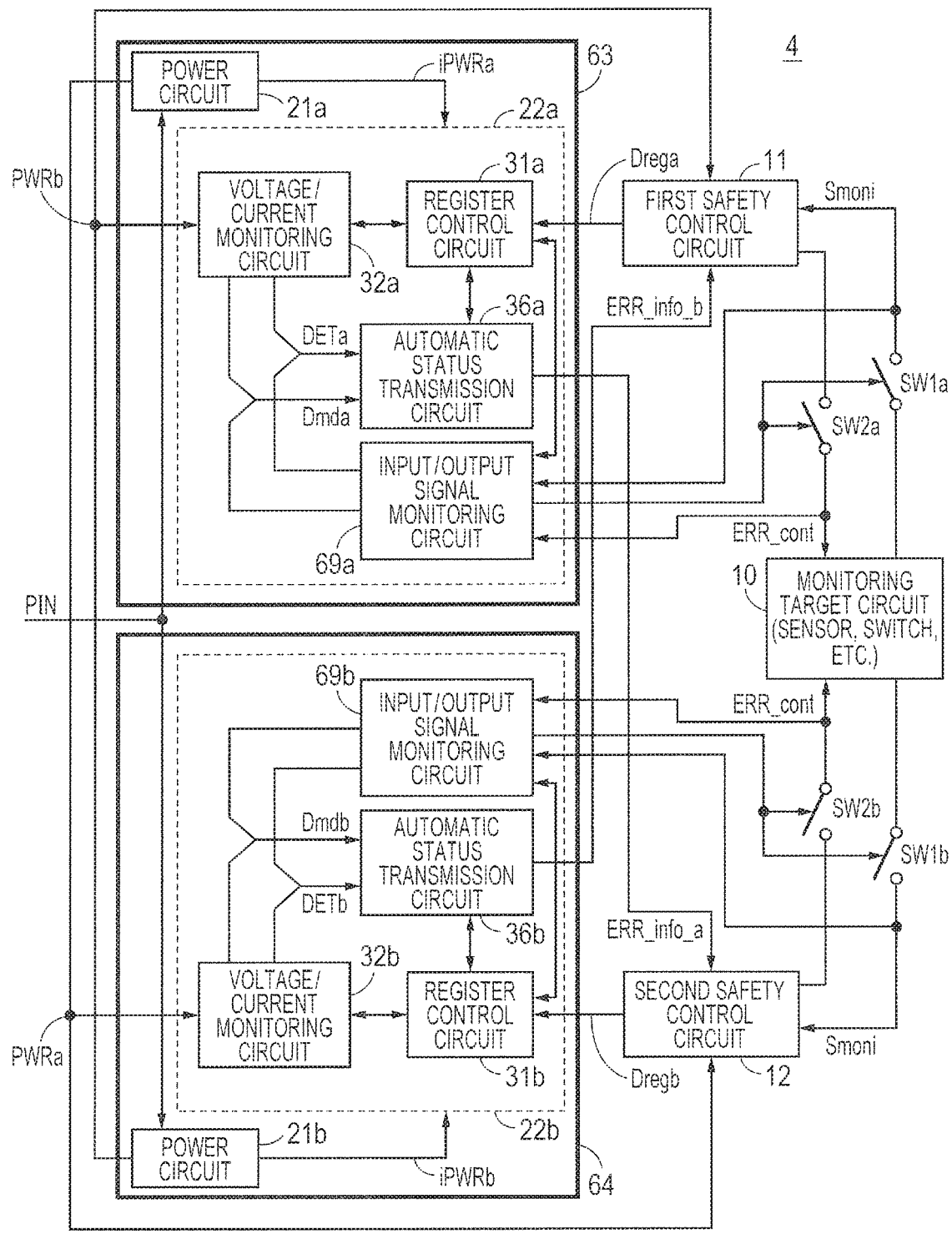
FIG. 11 is a block diagram illustrating the semiconductor device according to a fourth embodiment of the present invention.

FIG. 11 is a block diagram illustrating a semiconductor device 4 according to the fourth embodiment. As illustrated in FIG. 11, the first power monitoring circuit 63 according to the fourth embodiment is obtained by adding a signal monitoring circuit (e.g., an input/output signal monitoring circuit 69a) to the first power monitoring device 13 according to the first embodiment. The second power monitoring circuit 64 according to the fourth embodiment is obtained by adding a signal monitoring circuit (e.g., an input/output signal monitoring circuit 69b) to the second power monitoring device 14 according to the first embodiment. As the input/output signal monitoring circuit 69a and the input/output signal monitoring circuit 69b are identical with each other, the input/output signal monitoring circuit 69a is described below by way of example in order to explain about the input/output signal monitoring circuits.

The input/output signal monitoring circuit 69a monitors monitoring target signals other than operating power and compares the monitored monitoring target signals with expected values stored in a register in order to detect an abnormality in a device that inputs and outputs the monitoring target signal. More specifically, the input/output signal monitoring circuit 69a regards a monitoring signal Smoni inputted to the first safety control circuit 11 and an error control signal ERR_cont outputted from the first safety control circuit 11 as the monitoring target signals, and compares the expected values given from the first safety control circuit 11 with the monitoring target signals in order to detect an abnormality in the first safety control circuit 11. Further, the semiconductor device 4 according to the fourth embodiment is configured so that a switch SW1a is disposed in a path for conveying the monitoring signal Smoni, and that a switch SW2a is disposed in a path for conveying the error control signal ERR_cont. The input/output signal monitoring circuit 69*a* performs a diagnostic mode operation by using a switch control signal SW_cont to control the open/close state of the switch SW1*a* and the switch SW2*a*. The input/output signal monitoring circuit 69*a* has three operating modes, namely, a normal mode, a test mode, and a diagnostic mode, which will be described in detail later.

Figure 12:
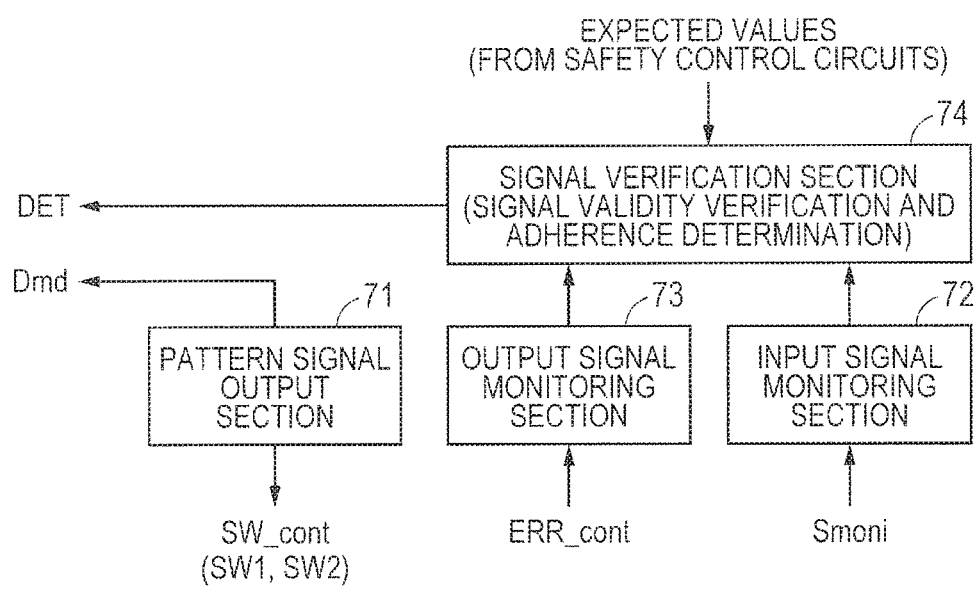
FIG. 12 is a block diagram illustrating an input/output signal monitoring circuit according to the fourth embodiment.

The input/output signal monitoring circuit 69*a* will now be described in detail. FIG. 12 is a block diagram illustrating the input/output signal monitoring circuit 69*a* according to the fourth embodiment. The input/output signal monitoring circuit 69*b* also includes the same blocks as those depicted in FIG. 12.

As illustrated in FIG. 12, the input/output signal monitoring circuit 69*a* according to the fourth embodiment includes a pattern signal output section 71, an input signal monitoring section 72, an output signal monitoring section 73, and a signal verification section 74. The pattern signal output section 71 changes the logic level of the switch control signal SW_cont in accordance with an internally preset pattern or a pattern given from the first safety control circuit 11.

The input signal monitoring section 72 receives the monitoring signal Smoni and conveys the received monitoring signal Smoni to the signal verification section 74. If, in this instance, the monitoring signal Smoni has an analog value, the input signal monitoring section 72 converts the analog value to a digital value, and outputs the resulting digital value to the signal verification section 74. The output signal monitoring section 73 receives the error control signal ERR_cont and conveys the received error control signal ERR_cont to the signal verification section 74. As the first safety control circuit 11 outputs a digital value as the error control signal ERR_cont, an analog-to-digital conversion function need not always be incorporated in the signal verification section 74.

The signal verification section 74 verifies signal validity and determines signal adherence by comparing the expected values given from the first safety control circuit 11 with measured values received from the input signal monitoring section 72 and the output signal monitoring section 73.

Settings of registers in the input/output signal monitoring circuits 69 will now be described. FIG. 13 illustrates exemplary definition information about registers that store operation settings of the input/output signal monitoring circuit 69*a* according to the fourth embodiment. Here, it is assumed that the input/output signal monitoring circuit 69*b* also includes the same registers as depicted in FIG. 13. As illustrated in FIG. 13, the input/output signal monitoring circuit 69*a* according to the fourth embodiment includes a mode setting register, a result determination register, and an expected value setting register.

The mode setting register sets the operating mode of the input/output signal monitoring circuit 69*a*. The mode setting register is configured so that six high-order bits of eight bits are set as an invalid setting region, and that a value for switching between the normal mode and the test mode is stored in the second bit position. If, for example, the value of the second bit is 0, the normal mode is selected. If the value of the second bit is 1, the test mode is selected. A value for switching between the diagnostic mode and the normal mode is stored in the first bit position. If, for example, the value of the first bit is 0, the normal mode is selected. If the value of the first bit is 1, the diagnostic mode is selected.

In the normal mode, the input/output signal monitoring circuit 69*a* detects an error in the monitoring signal Smoni and the error control signal ERR_cont with the switches SW1*a*, SW2*a* turned on. In the test mode, the input/output signal monitoring circuit 69*a* forcibly produces an error state by using an error detection expected value different from a usual expected value. The test mode is used to perform a diagnostic check to detect a failure in the input/output signal monitoring circuit 69*a*. In the diagnostic mode, the first safety control circuit 11 applies a pulse signal to an input/output signal path to diagnostically check for signal adherence. Simultaneous selection of the diagnostic mode and the test mode is prohibited. However, if the diagnostic mode and the test mode are simultaneously selected, it is assumed that the test mode takes precedence. Further, when the test mode and the diagnostic mode are selected and operated once, the operating mode automatically reverts to the normal mode without requiring an external setting.

The result determination register indicates the result of determination of the input/output signal monitoring circuit 69*a*. In the normal mode, if values acquired through the input signal monitoring section 72 and the output signal monitoring section 73 coincide with values stored in the expected value setting register, the input/output signal monitoring circuit 69*a* stores 1 in the result determination register. If the above values do not coincide with each other, the input/output signal monitoring circuit 69*a* stores 0 in the result determination register. In the diagnostic mode, however, if the value of the output signal of a pattern signal output circuit coincides with the values inputted through the input signal monitoring section 72 and the output signal monitoring section 73, the input/output signal monitoring circuits 69 store 0 in the result determination register. If the above values do not coincide with each other, the input/output signal monitoring circuits 69 store 1 in the result determination register.

The expected value setting register sets expected values of input and output signals in the normal mode. The expected values are given from the first safety control circuit 11. The expected value setting register depicted in the example of FIG. 13 is configured so that six high-order bits of an 8-bit region are defined as an invalid setting region. The second bit stores the expected value for a value acquired from the input signal monitoring section 72. The first bit stores the expected value for a signal acquired from the output signal monitoring section 73.

The input/output signal monitoring circuit 69*a* outputs the value of the result determination register as the determination signal DETa, and outputs the value of the mode setting register as the operating mode reporting signal Dmda.

Figure 14:
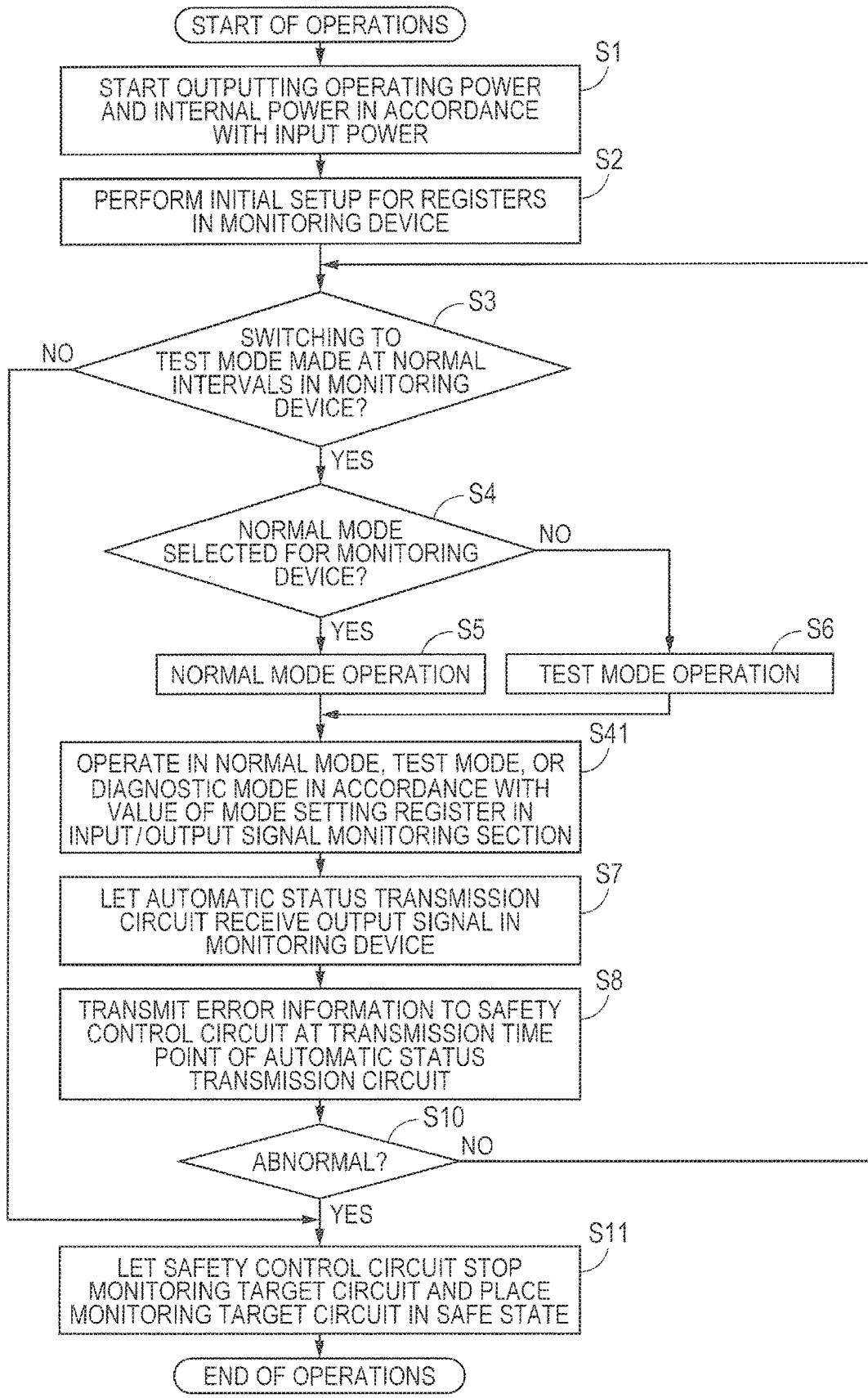
FIG. 14 is a flowchart illustrating the operations of the semiconductor device according to the fourth embodiment.

Operations of the semiconductor device 4 according to the fourth embodiment will now be described. FIG. 14 is a flowchart illustrating the operations of the semiconductor device 4 according to the fourth embodiment. As illustrated in FIG. 14, the operations of the semiconductor device 4 according to the fourth embodiment are such that step S41 is added to the operations of the semiconductor device 1 according to the first embodiment. Step S41 is performed subsequently to step S5 or S6. In step S41, the input/output signal monitoring circuit 69*a* operates in the normal mode, the test mode, or the diagnostic mode in accordance with the value of the mode setting register. After completion of step S41, the first power monitoring device 13 performs step S7, that is, receives the operating mode reporting signal Dmda and the determination signal DETa, which are outputted from the voltage/current monitoring circuit 32*a* and the input/output signal monitoring circuit 69*a*.

As described above, the semiconductor device 4 according to the fourth embodiment includes the input/output signal monitoring circuits. This makes it possible to detect an error in the input and output signals of the safety control circuits or an error in an input/output interface circuit of the safety control circuits. As a result, reliability is further improved by the semiconductor device 4, which uses the first power monitoring circuit 63 and the second power monitoring circuit 64.

While the present invention made by its inventors has been described in detail in terms of particular embodiments, the present invention is not limited to the above-described embodiments. It is to be understood by those skilled in the art that various modifications can be made without departing from the spirit and scope of the present invention.

What is claimed is:

1. A semiconductor device comprising:
a first power monitoring device that includes a first power circuit adapted to generate first operating power based on external power; and
a second power monitoring device that includes a second power circuit adapted to generate second operating power based on the external power,
wherein the first operating power is given from a second control section that gives a second setting indicative of an operation of the second power monitoring device to the second power monitoring device,
wherein the second operating power is given from a first control section that gives a first setting indicative of an operation of the first power monitoring device to the first power monitoring device,
wherein the first power monitoring device periodically monitors at least one of voltage and current of the second operating power in accordance with the first setting stored in a register, and if a monitored parameter is outside a preset reference range, the first power monitoring device outputs first error information to the second control section,
wherein the second power monitoring device periodically monitors at least one of voltage and current of the first operating power in accordance with the second setting stored in a register, and if a monitored parameter is outside a preset reference range, the second power monitoring device outputs second error information to the first control section,
wherein the first power monitoring device includes a first monitoring processing section that operates on first internal power outputted from the first power circuit,
wherein the second power monitoring device includes a second monitoring processing section that operates on second internal power outputted from the second power circuit,
wherein the first monitoring processing section and the second monitoring processing section each includes:
a power monitoring circuit that outputs an operating mode reporting signal for reporting a normal mode or a test mode as a current operating mode, the normal mode detecting an abnormality in a monitoring target operating power in accordance with a determination signal reporting a result of abnormality detection in the operating power and with a normal determination value determining that the operating power is abnormal, the test mode determining a status of the operating power in accordance with a test determination value that indicates an error even in the operating power in a normal state; and
an automatic status transmission circuit that generates error information in accordance with the operating mode reporting signal and a determination signal reporting a result of monitoring by the power monitoring circuit,
wherein the first monitoring processing section outputs the error information as the first error information, and
wherein the second monitoring processing section outputs the error information as the second error information.

2. The semiconductor device according to claim 1, wherein the automatic status transmission circuit includes:
a counter;
a transmission interval register that stores, as the count of the counter, intervals at which the error information is to be outputted;
a clock count storage register that stores the count of the counter;
a counter source clock register that sets a division ratio for a clock that is to be counted by the counter; and
a transmission control register that enables or disables a function for periodically outputting the error information, and
wherein the counter resets the count when the count reaches a value stored in the transmission interval register.

3. The semiconductor device according to claim 1, wherein the automatic status transmission circuit includes a transmission count data field for storing, as the error information, transmission count data having a value that cyclically changes at transmission intervals.

4. The semiconductor device according to claim 1, wherein the automatic status transmission circuit includes, as the error information, a determination signal data field and an operating mode data field, the determination signal data field storing information about the determination signal, the operating mode data field storing information about the operating mode reporting signal.

5. The semiconductor device according to claim 1, wherein the power monitoring circuit periodically switches between an operation in the normal mode and an operation in the test mode.

6. The semiconductor device according to claim 1, wherein the automatic status transmission circuit includes a timer that changes a logic level of the operating mode reporting signal at predetermined intervals, and
wherein the power monitoring circuit switches between an operation in the normal mode and an operation in the test mode in accordance with the operating mode reporting signal.

7. The semiconductor device according to claim 1, wherein the first monitoring processing section and the second monitoring processing section each include a power shutoff control circuit that determines, in accordance with the operating mode reporting signal and the determination signal, whether or not to output, to the outside, operating power to be monitored by a local device.

8. The semiconductor device according to claim 7, wherein the power shutoff control circuit includes:
an error status register that stores the value of the determination signal received together with the operating mode reporting signal indicative of the normal mode; and
a power shutoff factor enable register that defines a failure factor for shutting off the operating power.

9. The semiconductor device according to claim 1, wherein the first monitoring processing section and the second monitoring processing section each include a watchdog timer that monitors a operating state of a device that transmits a setting to a register in a local device, and wherein the watchdog timer outputs signals corresponding to the operating mode reporting signal and the determination signal.

10. The semiconductor device according to claim 1, wherein the first monitoring processing section and the second monitoring processing section each include a signal monitoring circuit that monitors a monitoring target signal other than the operating power and compares the monitored monitoring target signal with an expected value stored in a register in order to detect an abnormality in a device that inputs and outputs the monitoring target signal.

11. A semiconductor device comprising:
a first power wiring;
a second power wiring;
a first power monitoring device including a first power circuit that generates, based on external power, first operating power to be outputted to the first power wiring;
a second power monitoring device including a second power circuit that generates, based on the external power, second operating power to be outputted to the second power wiring;
a first control section that operates based on the second operating power and gives a first setting to a register in the first power monitoring device, the first setting defining the operation of the first power monitoring device; and
a second control section that operates based on the first operating power and gives a second setting to a register in the second power monitoring device, the second setting defining the operation of the second power monitoring device,
wherein the first power monitoring device periodically monitors at least one of voltage and current of the second operating power in accordance with the first setting stored in a register in a local device, and if a monitored parameter is outside a preset reference range, the first power monitoring device outputs first error information to the second control section,
wherein the second power monitoring device periodically monitors at least one of voltage and current of the first operating power in accordance with the second setting stored in a register in the local device, and if a monitored parameter is outside a preset reference range, the second power monitoring device outputs second error information,
wherein the first control section detects an abnormality in the first operating power in accordance with the second error information,
wherein the second control section detects an abnormality in the second operating power in accordance with the first error information,
wherein the first control section and the second control section monitor whether or not a same monitoring target circuit is abnormal, and if an abnormality occurs in the monitoring target circuit, the first control section and the second control section perform an error process on the monitoring target circuit in order to handle the abnormality.

12. The semiconductor device according to claim 11, wherein, if an abnormality in the first operating power is detected based on the second error information, the first control section performs an error process on the monitoring target circuit in order to handle the abnormality, and
wherein, if an abnormality in the first operating power is detected based on the second error information, the second control section performs an error process on the monitoring target circuit in order to handle the abnormality.

13. The semiconductor device according to claim 11, wherein the first power monitoring device includes:
a first watchdog timer that monitors the operation of the first control section; and
a first power shutoff control circuit that, if the first watchdog timer detects an abnormality in the operation of the first control section, shuts off a supply of the second operating power to the first control section, and
wherein the second power monitoring device includes:
a second watchdog timer that monitors the operation of the second control section; and
a second power shutoff control circuit that, if the second watchdog timer detects an abnormality in the operation of the second control section, shuts off the supply of the first operating power to the second control section.

14. The semiconductor device according to claim 11, wherein the first power monitoring device includes a first input/output monitoring circuit that monitors a first monitoring target signal inputted to and outputted from the first control section, and verifies a validity of the first monitoring target signal in accordance with an expected value given from the first control section, and
wherein the second power monitoring device includes a second input/output monitoring circuit that monitors a second monitoring target signal inputted to and outputted from the second control section, and verifies a validity of the second monitoring target signal in accordance with an expected value given from the second control section.

15. A power monitoring method that detects an abnormality in operating power supplied to a first control section and a second control section in a system for monitoring the operation of the same monitoring target circuit by using the first control section and the second control section, the power monitoring method comprising the steps of:
disposing a first power monitoring device and a second power monitoring device;
generating, by the first power monitoring device, first operating power to be supplied from an external power source to the second control section;
generating, by the second power monitoring device, second operating power to be supplied from the external power source to the first control section;
monitoring, by the first power monitoring device, abnormality in the second operating power;
monitoring, by the second power monitoring device, abnormality in the first operating power;
autonomously and periodically transmitting, by the first power monitoring device, the result of the monitoring to the second control section in accordance with a first setting given from the first control section; and
autonomously and periodically transmitting, by the second power monitoring device, the result of the monitoring to the first control section in accordance with a second setting given from the second control section,
wherein the first power monitoring device monitors the operation of the first control section, and if an abnormality is detected in the operation of the first control section as a result of monitoring, the first power monitoring device shuts off the supply of the second operating power to the first control section, and wherein the second power monitoring device monitors the operation of the second control section, and if an abnormality is detected in the operation of the second control section as a result of monitoring, the second power monitoring device shuts off the supply of the first operating power to the second control section.

16. The power monitoring method according to claim 15, wherein the first power monitoring device monitors a first monitoring target signal inputted to and outputted from the first control section and verifies a validity of the first monitoring target signal in accordance with an expected value given from the first control section, and wherein the second power monitoring device monitors a second monitoring target signal inputted to and outputted from the second control section and verifies a validity of the second monitoring target signal in accordance with an expected value given from the second control section.

* * * * *